US007918581B2

(12) United States Patent
Van De Ven et al.

(10) Patent No.: US 7,918,581 B2
(45) Date of Patent: Apr. 5, 2011

(54) LIGHTING DEVICE AND LIGHTING METHOD

(75) Inventors: Antony Paul Van De Ven, Hong Kong (CN); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 465 days.

(21) Appl. No.: 11/951,626

(22) Filed: Dec. 6, 2007

(65) Prior Publication Data

US 2008/0136313 A1 Jun. 12, 2008

Related U.S. Application Data

(60) Provisional application No. 60/868,986, filed on Dec. 7, 2006.

(51) Int. Cl.
*F21V 9/00* (2006.01)
(52) U.S. Cl. ............ 362/231; 257/89; 313/500; 445/24
(58) Field of Classification Search .................. None
See application file for complete search history.

(56) References Cited

U.S. PATENT DOCUMENTS

| | | | |
|---|---|---|---|
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 4,772,885 A | 9/1988 | Uehara et al. |
| 5,087,883 A | 2/1992 | Hoffman |
| 5,166,815 A | 11/1992 | Elderfield |
| 5,264,997 A | 11/1993 | Hutchinsson et al. |
| 5,407,799 A | 4/1995 | Studier |
| 5,410,519 A | 4/1995 | Hall et al. |

(Continued)

FOREIGN PATENT DOCUMENTS

DE 3 916 875 12/1990

(Continued)

OTHER PUBLICATIONS

Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.

(Continued)

*Primary Examiner* — Nimeshkumar D Patel
*Assistant Examiner* — Donald L Raleigh
(74) *Attorney, Agent, or Firm* — Burr & Brown

(57) ABSTRACT

A lighting device comprising first, second and third groups of solid state light emitters, and first and second groups of lumiphors. A mixture of light emitted from the first group of emitters and the first group of lumiphors has x,y color coordinates within an area defined by coordinates (0.36,0.48), (0.43,0.45), (0.5125,0.4866), and (0.4087,0.5896) (or (0.41, 0.455), (0.36,0.48), (0.4087,0.5896), and (0.4788,0.5202)). A mixture of light emitted from the second group of emitters and the second group of lumiphors is within an area defined by (0.32,0.40), (0.36,0.38), (0.30,0.26), and (0.25,0.29). A mixture of light from the first and second groups of emitters and the first and second groups of lumiphors is within an area defined by (0.32,0.40), (0.36,0.48), (0.43,0.45), (0.42,0.42), and (0.36,0.38) (or (0.32,0.40), (0.36,0.38), (0.41,0.455), and (0.36,0.48)). A mixture of light from all of these emitters and lumiphors is within ten MacAdam ellipses of the blackbody locus. Also, methods of lighting.

72 Claims, 5 Drawing Sheets

U.S. PATENT DOCUMENTS

Figure 1:
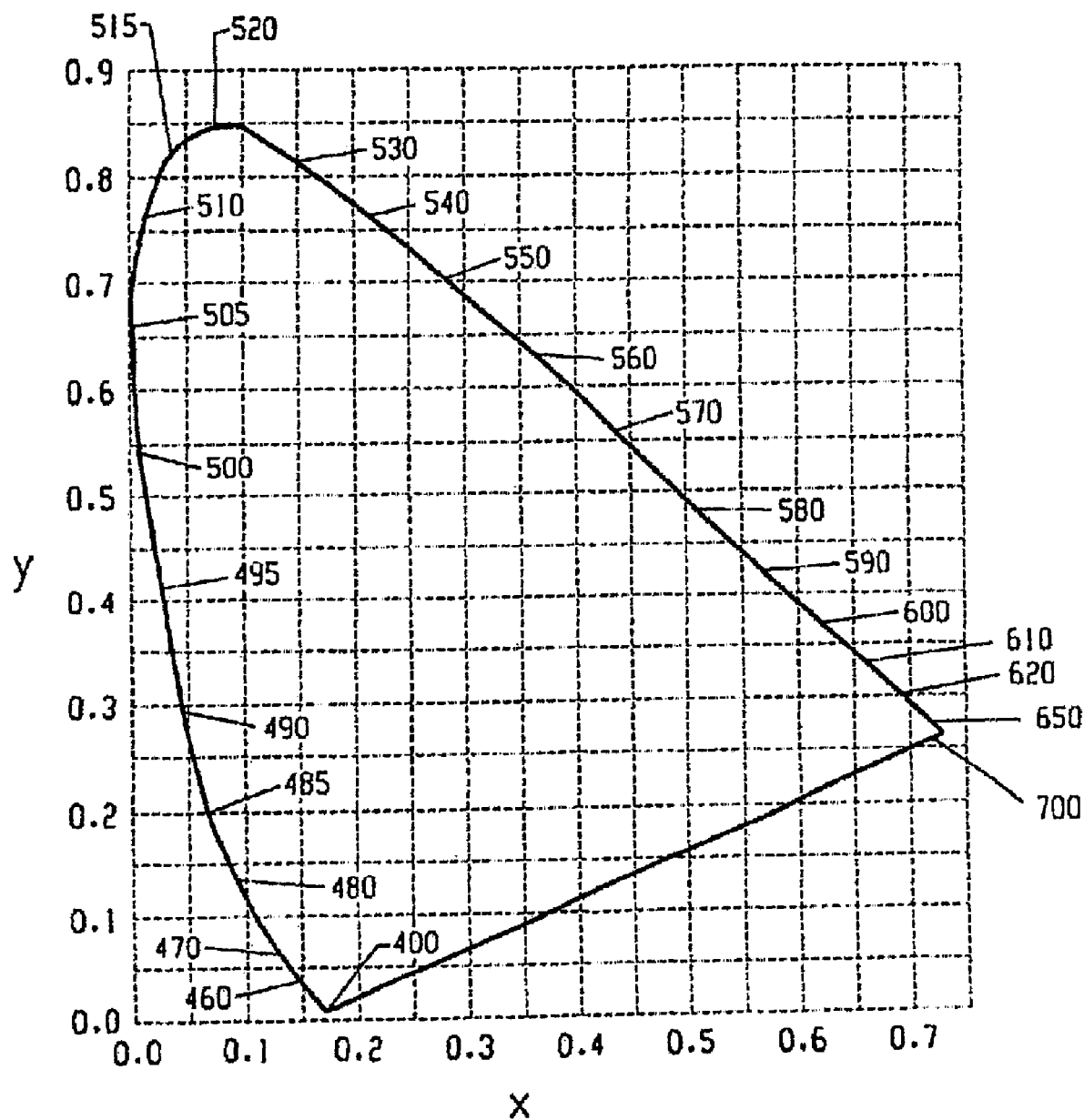

| | | |
|---|---|---|
| 5,477,436 A | 12/1995 | Bertling et al. |
| 5,563,849 A | 10/1996 | Hall et al. |
| 5,803,579 A | 9/1998 | Turnbull et al. |
| 5,851,063 A | 12/1998 | Doughty et al. |
| 5,959,316 A | 9/1999 | Lowery |
| 6,066,861 A | 5/2000 | Hohn et al. |
| 6,076,936 A | 6/2000 | George |
| 6,084,250 A | 7/2000 | Justel et al. |
| 6,095,666 A | 8/2000 | Salam |
| 6,132,072 A | 10/2000 | Turnbull et al. |
| 6,212,213 B1 | 4/2001 | Weber et al. |
| 6,234,648 B1 | 5/2001 | Borner et al. |
| 6,252,254 B1 | 6/2001 | Soules et al. |
| 6,255,670 B1 | 7/2001 | Srivastava et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,394,621 B1 | 5/2002 | Hanewinkel |
| 6,429,583 B1 | 8/2002 | Levinson et al. |
| 6,441,558 B1 | 8/2002 | Muthu et al. |
| 6,480,299 B1 | 11/2002 | Drakopoulos et al. |
| 6,501,100 B1 | 12/2002 | Srivastava et al. |
| 6,504,179 B1 | 1/2003 | Ellens et al. |
| 6,513,949 B1 | 2/2003 | Marshall et al. |
| 6,522,065 B1 | 2/2003 | Srivastava et al. |
| 6,538,371 B1 | 3/2003 | Duggal et al. |
| 6,550,949 B1 | 4/2003 | Bauer et al. |
| 6,552,495 B1 | 4/2003 | Chang |
| 6,577,073 B2 | 6/2003 | Shimizu et al. |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Mueller-Mach et al. |
| 6,608,485 B2 | 8/2003 | St-Germain |
| 6,616,862 B2 | 9/2003 | Srivastava et al. |
| 6,624,350 B2 | 9/2003 | Nixon et al. |
| 6,636,003 B2 | 10/2003 | Rahm et al. |
| 6,642,666 B1 | 11/2003 | St-Germain |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,712,486 B1 | 3/2004 | Popovich et al. |
| 6,737,801 B2 | 5/2004 | Ragle |
| 6,744,194 B2 | 6/2004 | Fukasawa et al. |
| 6,762,563 B2 | 7/2004 | St-Germain |
| 6,784,463 B2 | 8/2004 | Camras et al. |
| 6,791,257 B1 | 9/2004 | Sato et al. |
| 6,817,735 B2 | 11/2004 | Shimizu et al. |
| 6,841,804 B1 | 1/2005 | Chen et al. |
| 6,851,834 B2 | 2/2005 | Leysath |
| 6,880,954 B2 | 4/2005 | Ollet et al. |
| 6,882,101 B2 | 4/2005 | Ragle |
| 6,914,267 B2 | 7/2005 | Fukasawa et al. |
| 6,936,857 B2 | 8/2005 | Doxsee et al. |
| 6,967,116 B2 | 11/2005 | Negley |
| 6,980,176 B2 | 12/2005 | Matsumoto et al. |
| 7,005,679 B2 | 2/2006 | Tarsa et al. |
| 7,008,078 B2 | 3/2006 | Shimizu et al. |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,061,454 B2 | 6/2006 | Sasuga et al. |
| 7,066,623 B2 | 6/2006 | Lee et al. |
| 7,083,302 B2 | 8/2006 | Chen et al. |
| 7,093,958 B2 | 8/2006 | Coushaine |
| 7,095,056 B2 | 8/2006 | Vitta |
| 7,102,172 B2 | 9/2006 | Lynch et al. |
| 7,116,308 B1 | 10/2006 | Heeks et al. |
| 7,118,262 B2 | 10/2006 | Negley et al. |
| 7,125,143 B2 | 10/2006 | Hacker |
| 7,135,664 B2 | 11/2006 | Vornsand et al. |
| 7,144,121 B2 | 12/2006 | Minano et al. |
| 7,164,231 B2 | 1/2007 | Choi et al. |
| 7,207,691 B2 | 4/2007 | Lee et al. |
| 7,213,940 B1 | 5/2007 | Van De Ven et al. |
| 7,215,074 B2 | 5/2007 | Shimizu et al. |
| 7,232,212 B2 | 6/2007 | Iwase |
| 7,239,085 B2 | 7/2007 | Kawamura |
| 7,250,715 B2 | 7/2007 | Mueller et al. |
| 7,255,457 B2 | 8/2007 | Ducharme et al. |
| 7,256,557 B2 | 8/2007 | Lim |
| 7,322,732 B2 | 1/2008 | Negley et al. |
| 7,329,024 B2 | 2/2008 | Lynch et al. |
| 7,358,954 B2 | 4/2008 | Negley |
| 7,365,485 B2 | 4/2008 | Fukasawa et al. |
| 7,387,405 B2 | 6/2008 | Ducharme et al. |
| 7,422,504 B2 | 9/2008 | Maeda et al. |
| 7,453,195 B2 | 11/2008 | Radkov |
| 7,474,044 B2 | 1/2009 | Ge |
| 2001/0002049 A1 | 5/2001 | Reeh et al. |
| 2002/0006044 A1 | 1/2002 | Harbers et al. |
| 2002/0070681 A1 | 6/2002 | Shimizu et al. |
| 2002/0087532 A1 | 7/2002 | Barritz et al. |
| 2002/0149576 A1 | 10/2002 | Tanaka et al. |
| 2003/0026096 A1 | 2/2003 | Ellens et al. |
| 2003/0030063 A1 | 2/2003 | Sosniak et al. |
| 2003/0067773 A1 | 4/2003 | Marshall et al. |
| 2003/0146411 A1 | 8/2003 | Srivastava et al. |
| 2003/0222268 A1 | 12/2003 | Yocom et al. |
| 2004/0046178 A1 | 3/2004 | Sano |
| 2004/0105264 A1 | 6/2004 | Spero |
| 2004/0212998 A1 | 10/2004 | Mohacsi |
| 2004/0217364 A1 | 11/2004 | Tarsa et al. |
| 2004/0218387 A1 | 11/2004 | Gerlach |
| 2004/0218388 A1 | 11/2004 | Suzuki |
| 2004/0239839 A1 | 12/2004 | Hong |
| 2004/0264193 A1 | 12/2004 | Okumura |
| 2004/0264212 A1 | 12/2004 | Chung et al. |
| 2005/0007306 A1 | 1/2005 | Iisaka et al. |
| 2005/0052378 A1 | 3/2005 | Hacker |
| 2005/0082974 A1 | 4/2005 | Fukasawa et al. |
| 2005/0127381 A1 | 6/2005 | Vitta et al. |
| 2005/0190141 A1 | 9/2005 | Roth et al. |
| 2005/0231976 A1 | 10/2005 | Keuper et al. |
| 2005/0243556 A1 | 11/2005 | Lynch |
| 2005/0251698 A1 | 11/2005 | Lynch et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0180818 A1 | 8/2006 | Nagai et al. |
| 2006/0181192 A1 | 8/2006 | Radkov |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0051966 A1 | 3/2007 | Higashi et al. |
| 2007/0090381 A1 | 4/2007 | Otsuka et al. |
| 2007/0171145 A1 | 7/2007 | Coleman et al. |
| 2007/0202623 A1 | 8/2007 | Gao |
| 2007/0223219 A1 | 9/2007 | Medendorp et al. |
| 2007/0247414 A1 | 10/2007 | Robert |
| 2007/0247847 A1 | 10/2007 | Villard |
| 2007/0262337 A1 | 11/2007 | Villard |
| 2007/0276606 A1 | 11/2007 | Radkov |
| 2008/0088248 A1 | 4/2008 | Myers |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0137347 A1 | 6/2008 | Trott et al. |
| 2008/0170396 A1 | 7/2008 | Yuan et al. |

| | | | |
|---|---|---|---|
| 2008/0192462 A1 | 8/2008 | Steedly et al. | |
| 2008/0192493 A1 | 8/2008 | Villard | |
| 2008/0231201 A1 | 9/2008 | Higley et al. | |
| 2008/0278950 A1 | 11/2008 | Pickard et al. | |
| 2008/0278952 A1 | 11/2008 | Trott et al. | |
| 2008/0304269 A1 | 12/2008 | Pickard et al. | |
| 2008/0309255 A1 | 12/2008 | Myers | |
| 2009/0002986 A1 | 1/2009 | Medendorp et al. | |

FOREIGN PATENT DOCUMENTS

| | | |
|---|---|---|
| DE | 39 16 875 | 12/1990 |
| DE | 3916875 | 12/1990 |
| DE | 42 28 895 | 3/1994 |
| DE | 10-335077 | 3/2005 |
| DE | 103 35 077 | 3/2005 |
| EP | 0 838 866 | 4/1998 |
| EP | 0 971 421 | 1/2000 |
| EP | 1 024 399 | 8/2000 |
| EP | 1 081 771 | 3/2001 |
| EP | 1 160 883 | 12/2001 |
| EP | 1 193 772 | 4/2002 |
| EP | 1 367 655 | 12/2003 |
| EP | 1 380 876 | 1/2004 |
| EP | 1 462 711 | 9/2004 |
| EP | 1 462 711 | 12/2004 |
| EP | 1 566 848 | 8/2005 |
| EP | 1 571 715 | 9/2005 |
| EP | 1 760 795 | 1/2006 |
| JP | 04-159519 | 6/1992 |
| JP | 09-146089 | 6/1997 |
| JP | 10-163535 | 6/1998 |
| JP | 2000-022222 | 1/2000 |
| JP | 2000-183408 | 6/2000 |
| JP | 2001-111114 | 4/2001 |
| JP | 2001-156331 | 6/2001 |
| JP | 2001-307506 | 11/2001 |
| JP | 2002-150821 | 5/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005-101296 | 4/2005 |
| JP | 2005-142311 | 6/2005 |
| JP | 2007-122950 | 5/2007 |
| JP | 2007-141737 | 6/2007 |
| TW | 546854 | 8/2003 |
| WO | 98/43014 | 10/1998 |
| WO | 99/66483 | 12/1999 |
| WO | 00/34709 | 6/2000 |
| WO | 01/41215 | 6/2001 |
| WO | 01/43113 | 6/2001 |
| WO | 01/69692 | 9/2001 |
| WO | 03/056876 | 7/2003 |
| WO | 03/091771 | 11/2003 |
| WO | 2004/068909 | 8/2004 |
| WO | 2005/004202 | 1/2005 |
| WO | 2005013365 | 2/2005 |
| WO | 2005/013365 | 10/2005 |
| WO | 2005/124877 | 12/2005 |
| WO | 2005124877 | 12/2005 |
| WO | WO 2005/124877 | 12/2005 |
| WO | 2006/028312 | 3/2006 |
| WO | 2007/061758 | 5/2007 |

OTHER PUBLICATIONS

Cree® XLamp® 7090 XR-E Series LED Binning and Labeling.

White Light LED, Part Nos. NSPW300BS and NSPW312BS, High Brightness LEDs, Nov. 12, 1999, Publisher: Nichia Corporation.

Chhajed, S., *Influence of junction temperature on chromaticity and color-rendering properties of trichromatic white-light sources. . .* , Journal of Applied Physics, 2005, vol. 97pp. 1-8.

Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.

Color Kinetics Inc., *Color Quality of Intelligent Solid-State Light Systems*, Color Quality of Solid-State Light Sources, Mar. 2005, pp. 1-3.

Compound Semiconductors Online, "LED Lighting Fixtures, Inc. Sets World Record at 80 Lumens per Watt for Warm White", Compound Semiconductors Online, May 30, 2006, pp. 1.

Cree, Inc., "Cree® Xlamp® 7090 XR-E Series LED Binning and Labeling," Application Note: CLD-AP08.000, 7pp (2006).

CSA International, "Test Data Report," Project No. 1786317, Report No. 1786317-1 (Apr. 2006).

DOE SSL CALiPer Report, "Product Test Reference: CALiPER 07-31 Downlight Lamp".

DOE SSL CALiPer Report, "Product Test Reference: CALiPER 07-47 Downlight Lamp".

Krames et al., *Lumileds Lighting, Light from Silicon Valley*, Progress and Future Direction of LED Technology, SSL Workshop, Nov. 13, 2003, Publisher: Limileds Lighting Inc., pp. 1-21.

Narendran et al., "Solid State lighting: failure analysis of white LEDs," Journal of Cystal Growth, vol. 268, Issues 1-4, Aug. 2004, Abstract.

Narendran et al., *Color Rendering Properties of LED Light Sources, 2002*, pp. 1-8.

Nichia, White Light LED, Part Nos. NSPW300BS and NSPW312BS, High Brightness LEDs, Nov. 12, 1999, Publisher: Nichia Corporation.

Press Release from LED Lighting Fixtures dated Apr. 24, 2006 entitled "LED Lighting Fixtures, Inc. achieves unprecedented gain in light output from new luminaire".

Press Release from LED Lighting Fixtures dated Feb. 16, 2006 entitled "LED Lighting Fixtures, Inc. Announces Record Performance".

Press Release from LED Lighting Fixtures dated Jan. 26, 2006 entitled "LED Lighting Fixtures Creates 750 Lumen Recessed Light and Uses Only 16 Watts of Power".

Press Release from LED Lighting Fixtures dated May 30, 2006 entitled "LED Lighting Fixtures, Inc. Sets World Record at 80 Lumens per Watt for Warm White Fixture".

Optoled Lighting Inc., *OptoLED Product Information*, 2009, Publisher: OptoLED GmBH website: accessed at http://222.optoled.de/englisch/products/led.html.

Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.

LIGHTING DEVICE AND LIGHTING METHOD

CROSS-REFERENCE TO RELATED APPLICATIONS

This application claims the benefit of U.S. Provisional Patent Application No. 60/868,986, filed Dec. 7, 2006, the entirety of which is incorporated herein by reference.

FIELD OF THE INVENTION(S)

The present inventive subject matter relates to a lighting device, in particular, a device which includes one or more solid state light emitters (e.g., light emitting diodes) and one or more luminescent materials (e.g., one or more phosphors). The present inventive subject matter is also directed to lighting methods.

BACKGROUND OF THE INVENTION(S)

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about ten) but are still less efficient than solid state light emitters, such as light emitting diodes.

In addition, as compared to the normal lifetimes of solid state light emitters, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurement of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways. Driver response time, however, significantly decreases with lower CRI Ra values (for any given brightness, legibility decreases with lower CRI Ra).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where solid state light emitters are already being used, efforts are ongoing to provide solid state light emitter-containing devices which are improved, e.g., with respect to energy efficiency, color rendering index (CRI Ra), contrast, efficacy (lm/W), and/or duration of service.

Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present inventive subject matter can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The commonly recognized and commercially available light emitting diode ("LED") that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of solid state light emitters, e.g., light emitting diodes, has in many ways revolutionized the lighting industry, some of the characteristics of solid state light emitters have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI Ra).

Because light that is perceived as white is necessarily a blend of light of two or more colors (or wavelengths), no single light emitting diode junction has been developed that can produce white light. "White" light emitting diode lamps have been produced which have a light emitting diode pixel/cluster formed of respective red, green and blue light emitting diodes. Other "white" light emitting diode lamps have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of colors.

A wide variety of luminescent materials (and structures which contain luminescent materials, known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or translucent encapsulant material (e.g., epoxy-based, silicone-based, glass-based or metal oxide-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lamps" (i.e., lights which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces a blue emission and the phosphor produces yellow fluorescence on receiving that emission. For instance, in some designs, white light emitting diode lamps are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light. Another type uses a blue or violet light emitting diode chip which is combined with phosphor materials that produce red or orange and green or yellowish-green light rays. In such a lamp, part of the blue or violet light emitted by the light emitting diode chip excites the phosphors, causing the phosphors to emit red or orange and yellow or green light rays. These rays, combined with the blue or violet rays, can produce the perception of white light.

As also noted above, in another type of LED lamp, a light emitting diode chip that emits an ultraviolet ray is combined with phosphor materials that produce red (R), green (G) and blue (B) light rays. In such an "RGB LED lamp", the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Designs have been provided in which existing LED component packages and other electronics are assembled into a fixture. In such designs, a packaged LED is mounted to a circuit board or directly to a heat sink, the circuit board is mounted to a heat sink, and the heat sink is mounted to the fixture housing along with required drive electronics. In many cases, additional optics (secondary to the package parts) are also necessary.

In substituting solid state light emitters for other light sources, e.g., incandescent light bulbs, packaged LEDs have been used with conventional light fixtures, for example, fixtures which include a hollow lens and a base plate attached to the lens, the base plate having a conventional socket housing with one or more contacts which are electrically coupled to a power source. For example, LED light bulbs have been constructed which comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source.

There is an ongoing need for ways to use solid state light emitters, e.g., light emitting diodes, to provide white light in a wider variety of applications, with greater energy efficiency, with improved color rendering index (CRI Ra), with improved efficacy (lm/W), and/or with longer duration of service.

BRIEF SUMMARY OF THE INVENTION(S)

There exist "white" LED light sources which are relatively efficient but which have poor color rendering, typically having CRI Ra values of less than 75, and which are particularity deficient in the rendering of red colors and also to a significant extent deficient in green. This means that many things, including the typical human complexion, food items, labeling, painting, posters, signs, apparel, home decoration, plants, flowers, automobiles, etc. exhibit odd or wrong color as compared to being illuminated with an incandescent light or natural daylight. Typically, such white LED lamps have a color temperature of approximately 5000K, which is generally not visually comfortable for general illumination, which however may be desirable for the illumination of commercial produce or advertising and printed materials.

Some so-called "warm white" LED lamps have a more acceptable color temperature (typically 2700K to 3500K) for indoor use, and in some special cases, good CRI Ra (in the case of a yellow and red phosphor mix as high as Ra=95), but their efficiency is generally significantly less than that of the standard "cool white" LED lamps.

Colored objects illuminated by RGB LED lamps sometimes do not appear in their true colors. For example, an object that reflects only yellow light, and thus that appears to be yellow when illuminated with white light, may appear desaturated and grayish when illuminated with light having an apparent yellow color, produced by the red and green LEDs of an RGB LED fixture. Such lamps, therefore, are considered to not provide excellent color rendition, particularly when illuminating various settings such as in general illumination and particularly with regard to natural scenes. In addition, currently available green LEDs are relatively inefficient, and thus limit the efficiency of such lamps.

Employing LEDs having a wide variety of hues would similarly necessitate use of LEDs having a variety of efficiencies, including some with low efficiency, thereby reducing the efficiency of such systems and dramatically increasing the complexity and cost of the circuitry to control the many different types of LEDs and maintain the color balance of the light.

There is therefore a need for a high efficiency white light source that combines the efficiency and long life of white LED lamps (i.e., which avoids the use of relatively inefficient light sources) with an acceptable color temperature and good color rendering index, a wide gamut and simple control circuitry.

In accordance with the present inventive subject matter, it has unexpectedly been found that surprisingly high CRI Ra can be obtained, while obtaining surprisingly high efficacy, by (A)

mixing light from a first group of at least one solid state light emitter, light from a second group of at least one solid state light emitter, light from a third group of at least one solid state light emitter, light from a first group of at least one lumiphor and light from a second group of at least one lumiphor to form first group-second group-third group mixed illumination, where:

a mixture of light emitted from the first group of solid state light emitters and the first group of lumiphors would, in the absence of any additional light, have a first group mixed illumination having x, y color coordinates which define a point which is within an area on a 1931 CIE Chromaticity Diagram defined (as detailed below) by a set of points having x, y coordinates of (0.36, 0.48), (0.43, 0.45), (0.5125, 0.4866), and (0.4087, 0.5896);

a mixture of light emitted from the second group of solid state light emitters and the second group of lumiphors would, in the absence of any additional light, have a second group mixed illumination having x, y color coordinates which define a point which is within an area on a 1931 CIE Chromaticity Diagram defined by a set of points having x, y coordinates of (0.32, 0.40), (0.36, 0.38), (0.30, 0.26), and (0.25, 0.29);

a mixture of light emitted from the first group of solid state light emitters, the second group of solid state light emitters, the first group of lumiphors and the second group of lumiphors would, in the absence of any additional light, have a first group-second group mixed illumination having x, y color coordinates which define a point which is within an area on a 1931 CIE Chromaticity Diagram defined by a set of points having x, y coordinates of (0.32, 0.40), (0.36, 0.48), (0.43, 0.45), (0.42, 0.42), and (0.36, 0.38); and the first group-second group-third group mixed illumination having x, y coordinates on a 1931 CIE Chromaticity Diagram which define a point which is within ten MacAdam ellipses (and in some embodiments, within seven MacAdam ellipses) of at least one point on the blackbody locus on a 1931 CIE Chromaticity Diagram; or (B)

mixing light from a first group of at least one solid state light emitter, light from a second group of at least one solid state light emitter, light from a third group of at least one solid state light emitter, light from a first group of at least one lumiphor and light from a second group of at least one lumiphor to form first group-second group-third group mixed illumination, where:

a mixture of light emitted from the first group of solid state light emitters and the first group of lumiphors would, in the absence of any additional light, have a first group mixed illumination having x, y color coordinates which define a point which is within an area on a 1931 CIE Chromaticity Diagram defined by a set of points having x, y coordinates of (0.41, 0.455), (0.36, 0.48), (0.4087, 0.5896) and (0.4788, 0.5202);

a mixture of light emitted from the second group of solid state light emitters and the second group of lumiphors would, in the absence of any additional light, have a second group mixed illumination having x, y color coordinates which define a point which is within an area on a 1931 CIE Chromaticity Diagram defined by a set of points having x, y coordinates of (0.32, 0.40), (0.36, 0.38), (0.30, 0.26), and (0.25, 0.29);

a mixture of light emitted from the first group of solid state light emitters, the second group of solid state light emitters, the first group of lumiphors and the second group of lumiphors would, in the absence of any additional light, have a first group-second group mixed illumination having x, y color coordinates which define a point which is within an area on a 1931 CIE Chromaticity Diagram defined by a set of points having x, y coordinates of (0.32, 0.40), (0.36, 0.38), (0.41, 0.455) and (0.36, 0.48); and the first group-second group-third group mixed illumination having x, y coordinates on a 1931 CIE Chromaticity Diagram which define a point which is within ten MacAdam ellipses (and in some embodiments, within seven MacAdam ellipses) of at least one point on the blackbody locus on a 1931 CIE Chromaticity Diagram.

Accordingly, in a first aspect of the present inventive subject matter, there is provided a lighting device comprising a first group of solid state light emitters, a first group of lumiphors, a second group of solid state light emitters, a second group of lumiphors and a third group of solid state light emitters. In this first aspect of the present inventive subject matter:

if each of the first group of solid state light emitters is illuminated and each of the first group of lumiphors is excited, a mixture of light emitted from the first group of solid state light emitters and the first group of lumiphors would, in the absence of any additional light, have a first group mixed illumination having x, y color coordinates which define a point which is within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.36, 0.48, the second point having x, y coordinates of 0.43, 0.45, the third point having x, y coordinates of 0.5125, 0.4866, and the fourth point having x, y coordinates of 0.4087, 0.5896;

if each of the second group of solid state light emitters is illuminated and each of the second group of lumiphors is excited, a mixture of light emitted from the second group of solid state light emitters and the second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, the fifth line segment connecting a fifth point to a sixth point, the sixth line segment connecting the sixth point to a seventh point, the seventh line segment connecting the seventh point to an eighth point, and the eighth line segment connecting the eighth point to the fifth point, the fifth point having x, y coordinates of 0.32, 0.40, the sixth point having x, y coordinates of 0.36, 0.38, the seventh point having x, y coordinates of 0.30, 0.26, and the eighth point having x, y coordinates of 0.25, 0.29;

if each of the first group of solid state light emitters and the second group of solid state light emitters is illuminated and each of the first group of lumiphors and the second group of lumiphors is excited, a mixture of light emitted from the first group of solid state light emitters, the second group of solid state light emitters, the first group of lumiphors and the second group of lumiphors would, in the absence of any additional light, have a first group-second group mixed illumination having x, y color coordinates which define a point which is within an area on a 1931 CIE Chromaticity Diagram enclosed by ninth, tenth, eleventh, twelfth and thirteenth line segments, the ninth line segment connecting a ninth point to a tenth point, the tenth line segment connecting the tenth point to an eleventh point, the eleventh line segment connecting the eleventh point to a twelfth point, the twelfth line segment connecting the twelfth point to a thirteenth point, and the thirteenth line segment connecting the thirteenth point to the ninth point, the ninth point having x, y coordinates of 0.32, 0.40, the tenth point having x, y coordinates of 0.36, 0.48, the eleventh point having x, y coordinates of 0.43, 0.45, the twelfth point having x, y coordinates of 0.42, 0.42, and the thirteenth point having x, y coordinates of 0.36, 0.38; and if each of the first group of solid state light emitters, the second group of solid state light emitters and the third group of solid state light emitters is illuminated and each of the first group of lumiphors and the second group of lumiphors is excited, a mixture of light emitted from the first group of solid state light emitters, the second group of solid state light emitters, the third group of solid state light emitters, the first group of lumiphors and the second group of lumiphors would, in the absence of any additional light, have a first group-second group-third group mixed illumination having x, y coordinates on a 1931 CIE Chromaticity Diagram which define a point which is within ten MacAdam ellipses (and in some embodiments, within seven MacAdam ellipses or, in other embodiments, within eight Macadam ellipses, within six Macadam ellipses, within four Macadam ellipses, and/or within two Macadam ellipses) of at least one point on the blackbody locus on a 1931 CIE Chromaticity Diagram.

In a second aspect of the present inventive subject matter, there is provided a lighting device comprising a first group of solid state light emitters, a first group of lumiphors, a second group of solid state light emitters, a second group of lumiphors and a third group of solid state light emitters. In this second aspect of the present inventive subject matter:

if each of the first group of solid state light emitters is illuminated and each of the first group of lumiphors is excited, a mixture of light emitted from the first group of solid state light emitters and the first group of lumiphors would, in the absence of any additional light, have a first group mixed illumination having x, y color coordinates which define a point which is within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.41, 0.455, the second point having x, y coordinates of 0.36, 0.48, the third point having x, y coordinates of 0.4087, 0.5896, and the fourth point having x, y coordinates of 0.4788, 0.5202;

if each of the second group of solid state light emitters is illuminated and each of the second group of lumiphors is excited, a mixture of light emitted from the second group of solid state light emitters and the second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, the fifth line segment connecting a fifth point to a sixth point, the sixth line segment connecting the sixth point to a seventh point, the seventh line segment connecting the seventh point to an eighth point, and the eighth line segment connecting the eighth point to the fifth point, the fifth point having x, y coordinates of 0.32, 0.40, the sixth point having x, y coordinates of 0.36, 0.38, the seventh point having x, y coordinates of 0.30, 0.26, and the eighth point having x, y coordinates of 0.25, 0.29;

if each of the first group of solid state light emitters and the second group of solid state light emitters is illuminated and each of the first group of lumiphors and the second group of lumiphors is excited, a mixture of light emitted from the first group of solid state light emitters, the second group of solid state light emitters, the first group of lumiphors and the second group of lumiphors would, in the absence of any additional light, have a first group-second group mixed illumination having x, y color coordinates which define a point which is within an area on a 1931 CIE Chromaticity Diagram enclosed by ninth, tenth, eleventh and twelfth line segments, the ninth line segment connecting a ninth point to a tenth point, the tenth line segment connecting the tenth point to an eleventh point, the eleventh line segment connecting the eleventh point to a twelfth point, and the twelfth line segment connecting the twelfth point to the ninth point, the ninth point having x, y coordinates of 0.32, 0.40, the tenth point having x, y coordinates of 0.36, 0.38, the eleventh point having x, y coordinates of 0.41, 0.455, and the twelfth point having x, y coordinates of 0.36, 0.48; and if each of the first group of solid state light emitters, the second group of solid state light emitters and the third group of solid state light emitters is illuminated and each of the first group of lumiphors and the second group of lumiphors is excited, a mixture of light emitted from the first group of solid state light emitters, the second group of solid state light emitters, the third group of solid state light emitters, the first group of lumiphors and the second group of lumiphors would, in the absence of any additional light, have a first group-second group-third group mixed illumination having x, y coordinates on a 1931 CIE Chromaticity Diagram which define a point which is within ten MacAdam ellipses (and in some embodiments, within seven MacAdam ellipses, in other embodiments, within eight Macadam ellipses, within six Macadam ellipses, within four Macadam ellipses, and/or within two Macadam ellipses) of at least one point on the blackbody locus on a 1931 CIE Chromaticity Diagram.

With regard to any mixed light described herein in terms of its proximity (in MacAdam ellipses) to the blackbody locus on a 1931 CIE Chromaticity Diagram, the present inventive subject matter is further directed to such mixed light in the proximity of light on the blackbody locus having color temperature of 2700 K, 3000 K or 3500 K, namely:

mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4578, 0.4101, the second point having x, y coordinates of 0.4813, 0.4319, the third point having x, y coordinates of 0.4562, 0.4260, the fourth point having x, y coordinates of 0.4373, 0.3893, and the fifth point having x, y coordinates of 0.4593, 0.3944 (i.e., proximate to 2700 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4338, 0.4030, the second point having x, y coordinates of 0.4562, 0.4260, the third point having x, y coordinates of 0.4299, 0.4165, the fourth point having x, y coordinates of 0.4147, 0.3814, and the fifth point having x, y coordinates of 0.4373, 0.3893 (i.e., proximate to 3000 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4073, 0.3930, the second point having x, y coordinates of 0.4299, 0.4165, the third point having x, y coordinates of 0.3996, 0.4015, the fourth point having x, y coordinates of 0.3889, 0.3690, and the fifth point having x, y coordinates of 0.4147, 0.3814 (i.e., proximate to 3500 K).

In a third aspect of the present inventive subject matter, there is provided a method of lighting, comprising:

mixing light from a first group of at least one solid state light emitter, light from a second group of at least one solid state light emitter, light from a third group of at least one solid state light emitter, light from a first group of at least one lumiphor and light from a second group of at least one lumiphor to form first group-second group-third group mixed illumination, where:

a mixture of light emitted from the first group of solid state light emitters and the first group of lumiphors would, in the absence of any additional light, have a first group mixed illumination having x, y color coordinates which define a point which is within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.36, 0.48, the second point having x, y coordinates of 0.43, 0.45, the third point having x, y coordinates of 0.5125, 0.4866, and the fourth point having x, y coordinates of 0.4087, 0.5896;

a mixture of light emitted from the second group of solid state light emitters and the second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, the fifth line segment connecting a fifth point to a sixth point, the sixth line segment connecting the sixth point to a seventh point, the seventh line segment connecting the seventh point to an eighth point, and the eighth line segment connecting the eighth point to the fifth point, the fifth point having x, y coordinates of 0.32, 0.40, the sixth point having x, y coordinates of 0.36, 0.38, the seventh point having x, y coordinates of 0.30, 0.26, and the eighth point having x, y coordinates of 0.25, 0.29;

a mixture of light emitted from the first group of solid state light emitters, the second group of solid state light emitters, the first group of lumiphors and the second group of lumiphors would, in the absence of any additional light, have a first group-second group mixed illumination having x, y color coordinates which define a point which is within an area on a 1931 CIE Chromaticity Diagram enclosed by ninth, tenth, eleventh, twelfth and thirteenth line segments, the ninth line segment connecting a ninth point to a tenth point, the tenth line segment connecting the tenth point to an eleventh point, the eleventh line segment connecting the eleventh point to a twelfth point, the twelfth line segment connecting the twelfth point to a thirteenth point, and the thirteenth line segment connecting the thirteenth point to the ninth point, the ninth point having x, y coordinates of 0.32, 0.40, the tenth point having x, y coordinates of 0.36, 0.48, the eleventh point having x, y coordinates of 0.43, 0.45, the twelfth point having x, y coordinates of 0.42, 0.42, and the thirteenth point having x, y coordinates of 0.36, 0.38; and the first group-second group-third group mixed illumination having x, y coordinates on a 1931 CIE Chromaticity Diagram which define a point which is within ten MacAdam ellipses (and in some embodiments, within seven MacAdam ellipses, in other embodiments, within eight Macadam ellipses, within six Macadam ellipses, within four Macadam ellipses, and/or within two Macadam ellipses) of at least one point on the blackbody locus on a 1931 CIE Chromaticity Diagram.

In a fourth aspect of the present inventive subject matter, there is provided a method of lighting, comprising:

mixing light from a first group of at least one solid state light emitter, light from a second group of at least one solid state light emitter, light from a third group of at least one solid state light emitter, light from a first group of at least one lumiphor and light from a second group of at least one lumiphor to form first group-second group-third group mixed illumination, where:

a mixture of light emitted from the first group of solid state light emitters and the first group of lumiphors would, in the absence of any additional light, have a first group mixed illumination having x, y color coordinates which define a point which is within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.41, 0.455, the second point having x, y coordinates of 0.36, 0.48, the third point having x, y coordinates of 0.4087, 0.5896, and the fourth point having x, y coordinates of 0.4788, 0.5202;

a mixture of light emitted from the second group of solid state light emitters and the second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, the fifth line segment connecting a fifth point to a sixth point, the sixth line segment connecting the sixth point to a seventh point, the seventh line segment connecting the seventh point to an eighth point, and the eighth line segment connecting the eighth point to the fifth point, the fifth point having x, y coordinates of 0.32, 0.40, the sixth point having x, y coordinates of 0.36, 0.38, the seventh point having x, y coordinates of 0.30, 0.26, and the eighth point having x, y coordinates of 0.25, 0.29;

a mixture of light emitted from the first group of solid state light emitters, the second group of solid state light emitters, the first group of lumiphors and the second group of lumiphors would, in the absence of any additional light, have a first group-second group mixed illumination having x, y color coordinates which define a point which is within an area on a 1931 CIE Chromaticity Diagram enclosed by ninth, tenth, eleventh and twelfth line segments, the ninth line segment connecting a ninth point to a tenth point, the tenth line segment connecting the tenth point to an eleventh point, the eleventh line segment connecting the eleventh point to a twelfth point, and the twelfth line segment connecting the twelfth point to the ninth point, the ninth point having x, y coordinates of 0.32, 0.40, the tenth point having x, y coordinates of 0.36, 0.38, the eleventh point having x, y coordinates of 0.41, 0.455, and the twelfth point having x, y coordinates of 0.36, 0.48; and the first group-second group-third group mixed illumination having x, y coordinates on a 1931 CIE Chromaticity Diagram which define a point which is within ten MacAdam ellipses (and in some embodiments, within seven MacAdam ellipses, in other embodiments, within eight Macadam ellipses, within six Macadam ellipses, within four Macadam ellipses, and/or within two Macadam ellipses) of at least one point on the blackbody locus on a 1931 CIE Chromaticity Diagram.

In some embodiments according to the present inventive subject matter, one or more of the solid state light emitters in the first, second and/or third groups of solid state light emitters is/are a light emitting diode.

In some embodiments according to the present inventive subject matter:

each solid state light emitter in the first and second groups of solid state light emitters, if illuminated, would emit light having a peak wavelength in the range of from 430 nm to 480 nm;

each lumiphor in the first and second groups of lumiphors, if excited, would emit light having a dominant wavelength in the range of from about 555 nm to about 585 nm; and each of the third group of solid state light emitters, if illuminated, would emit light having a dominant wavelength in the range of from 600 nm to 630 nm;

In some embodiments according to the present inventive subject matter, if every solid state light emitter in the lighting device is illuminated, the lighting device would emit light having x, y color coordinates which are within the respective areas on a 1931 CIE Chromaticity Diagram as defined above.

In some embodiments according to the present inventive subject matter, the lighting device further comprises at least one power line, and if power is supplied to each of the at least one power line, the lighting device would emit light having x, y color coordinates which are within the respective areas on a 1931 CIE Chromaticity Diagram as defined above.

In some embodiments according to the present inventive subject matter, the lighting device further comprises an additional group of solid state light emitters comprising at least one solid state light emitter which, if illuminated, would emit saturated light.

In some embodiments according to the present inventive subject matter, the lighting device, when supplied with electricity of a first wattage, emits output light of an efficacy of at least 60 lumens per watt (in some embodiments at least 70 lumens per watt, and in some embodiments, at least 80 lumens per watt) of the electricity. In some such embodiments, the output light is of a brightness of at least 300 lumens, in some embodiments at least 500 lumens.

In some embodiments according to the present inventive subject matter, if each of the first group of solid state light emitters and the second group of solid state light emitters is illuminated and each of the first group of lumiphors and the second group of lumiphors is excited, the first group-second group mixed illumination has x, y color coordinates on a 1931 CIE Chromaticity Diagram which are also at least a distance of 0.03 (in some embodiments, at least a distance of 0.045) from any point on the blackbody locus.

In some embodiments according to the present inventive subject matter, the first and second groups of solid state light emitters together comprise all of the solid state light emitters in the lighting device which, if illuminated, would emit light having a peak wavelength in the range of from about 430 nm to about 480 nm, and the first and second groups of lumiphors together comprise all of the lumiphors in the lighting device which, if excited, would emit light having a dominant wavelength in the range of from about 555 nm to about 585 nm.

In some embodiments according to the present inventive subject matter, the lighting device further comprises at least one power line, and the first and second groups of solid state light emitters together comprise all solid state light emitters which are directly or switchably electrically connected to the at least one power line and which, if illuminated, would emit light having a peak wavelength in the range of from 430 nm to 480 nm.

In some embodiments according to the present inventive subject matter, the first and second groups of lumiphors together comprise all lumiphors which are illuminated if power is supplied to the at least one power line, and each of the lumiphors in the first and second groups of lumiphors is excited if power is supplied to the at least one power line.

In some embodiments according to the present inventive subject matter, if all of the solid state light emitters in the first and second groups of solid state light emitters are illuminated, each of the lumiphors in the first and second groups of lumiphors would be excited by light emitted from at least one of the solid state light emitters.

In some embodiments according to the present inventive subject matter, each of the solid state light emitters in the first and second groups of solid state light emitters is embedded within an encapsulant element in which at least one of the first and second groups of lumiphors is also embedded.

In some embodiments according to the present inventive subject matter, the first and second groups of solid state light emitters together comprise at least five solid state light emitters, and the first and second groups of lumiphors together comprise at least five lumiphors.

In some embodiments according to the present inventive subject matter, the first and second groups of solid state light emitters together comprise at least ten solid state light emitters, and the first and second groups of lumiphors together comprise at least ten lumiphors.

In some embodiments according to the present inventive subject matter, the first and second groups of solid state light emitters together comprise at least twenty-five solid state light emitters, and the first and second groups of lumiphors together comprise at least twenty-five lumiphors.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosure (uniformly or non-uniformly).

In a further aspect, the present inventive subject matter is directed to a lighting element, comprising a surface and at least one lighting device as described above, wherein if the lighting device is illuminated, the lighting device would illuminate at least a portion of the surface.

In a further aspect, the present inventive subject matter is directed to a light fixture comprising at least one lighting device as described above.

In some embodiments according to the present inventive subject matter, if the lighting device is supplied with electricity of the first wattage, a mixture of all light exiting from the lighting device which was emitted by one of the at least one solid state light emitter which emit light having a dominant wavelength which is outside the range of between 600 nm and 700 nm, and all light exiting from the lighting device which was emitted by one of the at least one lumiphor which emit light having a dominant wavelength which is outside the range of between 600 nm and 700 nm, would have x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

BRIEF DESCRIPTION OF THE DRAWING FIGURES

Figure 2:
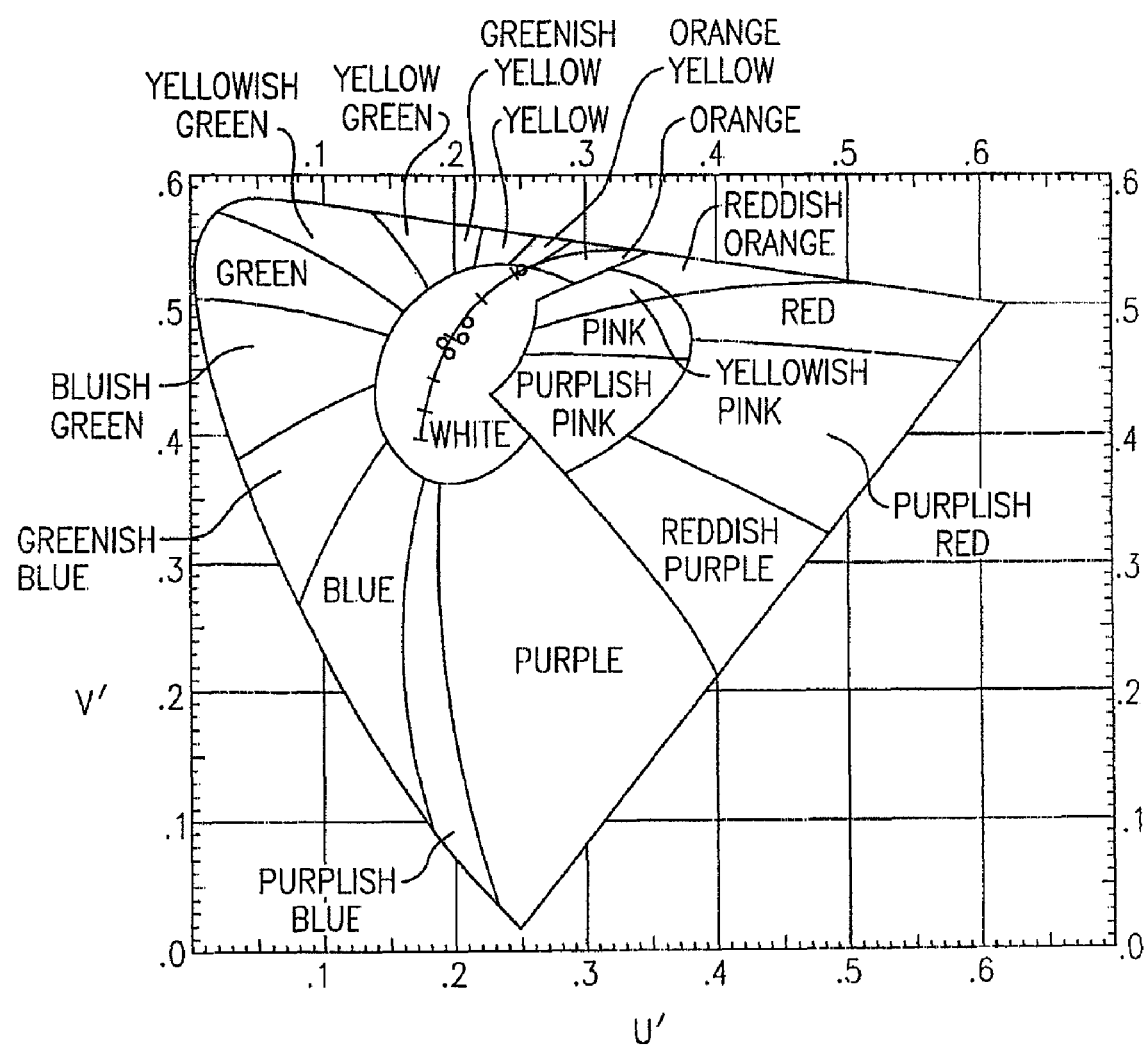
Figure 3:
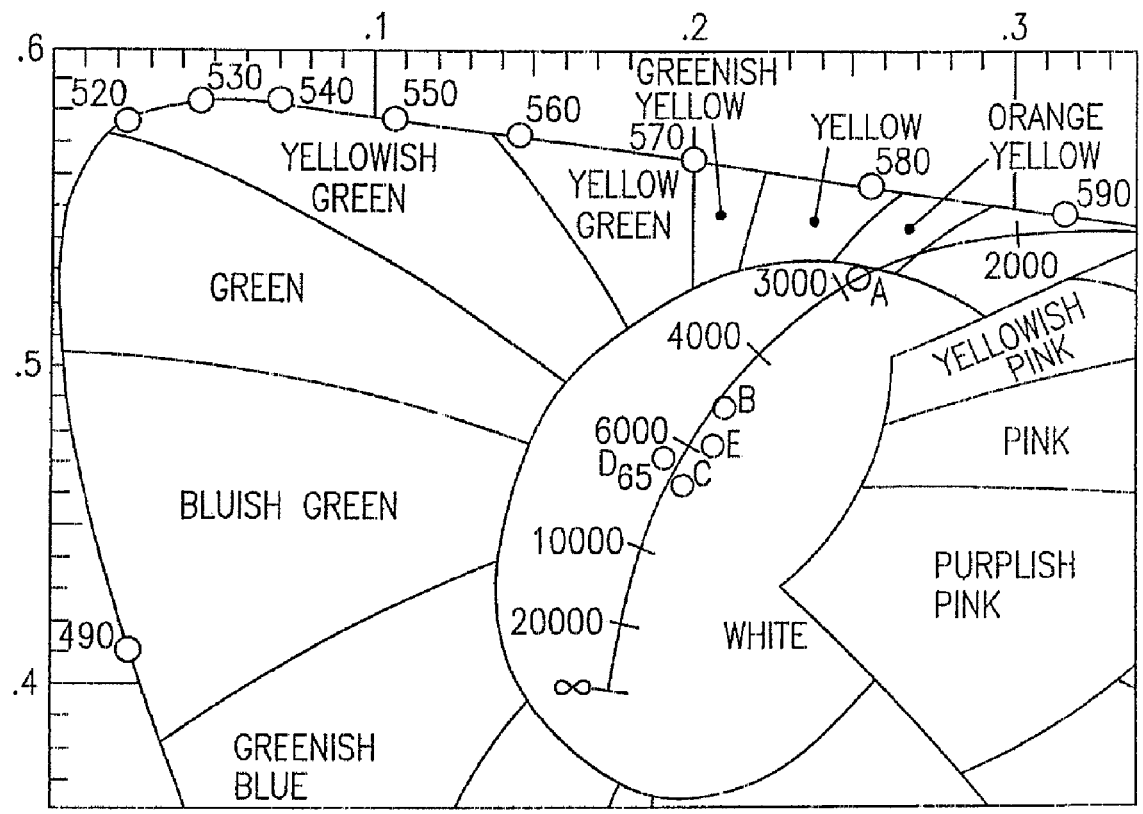
Figure 4:
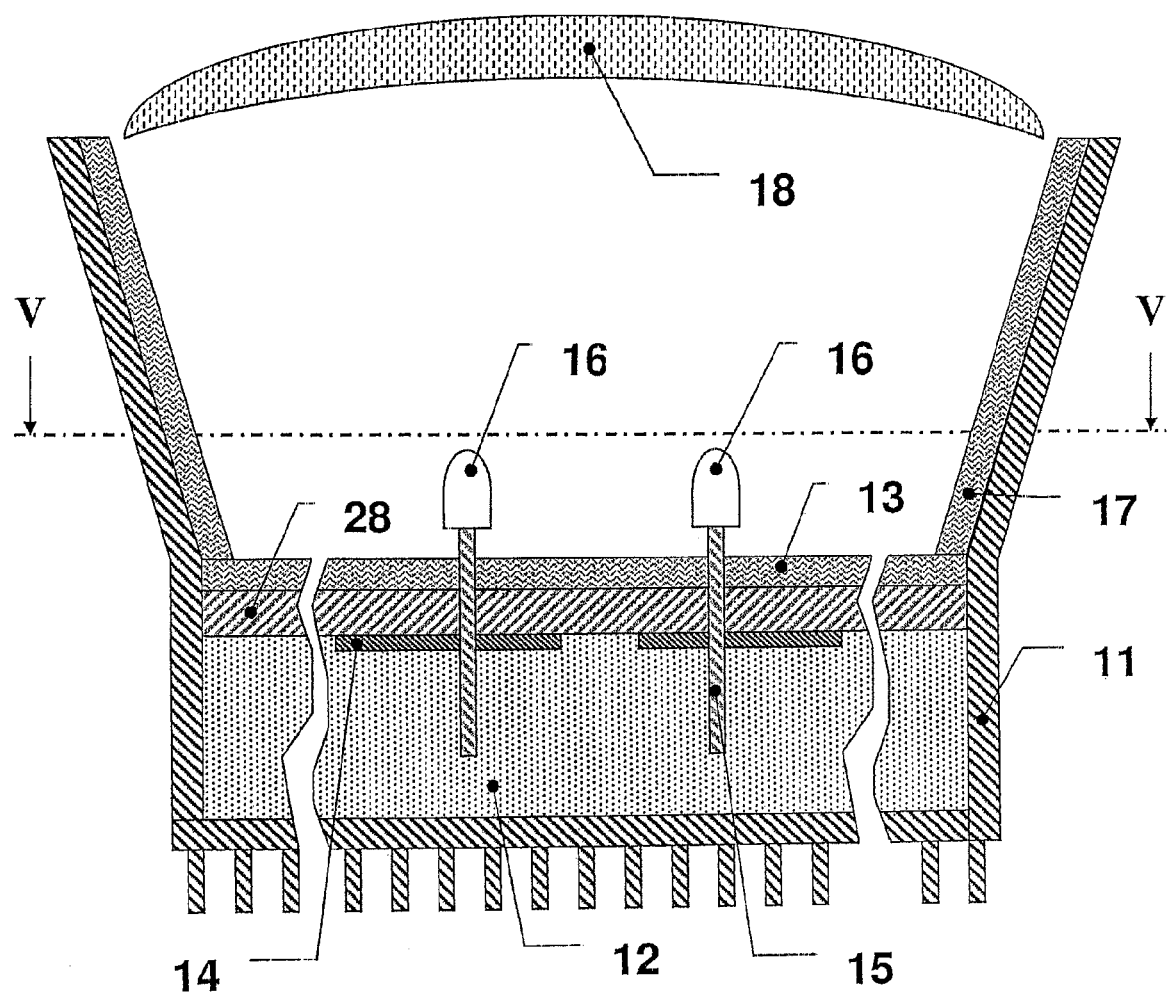
Figure 5:
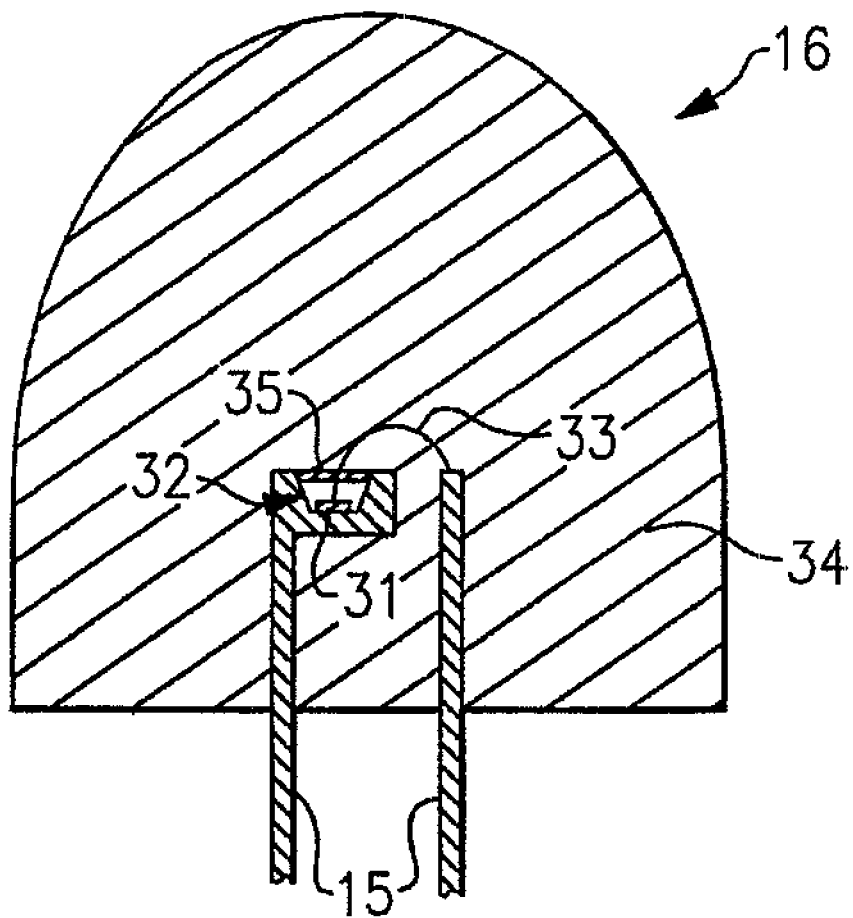

FIG. 1 shows the 1931 CIE Chromaticity Diagram.
FIG. 2 shows the 1976 Chromaticity Diagram.
FIG. 3 shows an enlarged portion of the 1976 Chromaticity Diagram, in order to show the blackbody locus in detail.
FIG. 4 depicts a first embodiment of a lighting device in accordance with the present inventive subject matter.
FIG. 5 depicts a representative example of a packaged LED which can be used in the devices according to the present inventive subject matter.

DETAILED DESCRIPTION OF THE INVENTION(S)

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Furthermore, relative terms, such as "lower" or "bottom" and "upper" or "top," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

A statement herein that two components in a device are "electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board or another medium, are electrically connected.

The expression "saturated", as used herein, means having a purity of at least 85%, the term "purity" having a well-known meaning to persons skilled in the art, and procedures for calculating purity being well-known to those of skill in the art.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

The solid state light emitter (or solid state light emitters) used in the devices according to the present inventive subject matter, and the lumiphor (or lumiphors) used in the devices according to the present inventive subject matter, can be selected from among any solid state light emitters and lumiphors known to persons of skill in the art. Wide varieties of such solid state light emitters and lumiphors are readily obtainable and well known to those of skilled in the art, and any of them can be employed.

Examples of types of such solid state light emitters include inorganic and organic light emitting diodes, a variety of each of which are well-known in the art.

The solid state light emitters can be positioned, grouped and/or packaged in any desired way, a wide variety of which are possible. For instance, each solid state light emitter can be positioned separately, optionally contained in a package (e.g., in the form of packaged LEDs), or one or more elements each having a plurality of solid state light emitters can be provided (e.g., in the form of a plurality of solid state light emitters contained in a single package, such as those described in U.S. Patent Application No. 60/808,702, filed on May 26, 2006, entitled "Lighting Device" (inventors: Gerald H. Negley and Antony Paul van de Ven) and U.S. patent application Ser. No. 11/751,982, filed May 22, 2007 (now U.S. Patent Publication No. 2007/0274080), the entireties of which are hereby incorporated by reference). For example, the device can include a first package which comprises at least five of the first group of solid state light emitters and at least five of the second group of solid state light emitters (in such a device, (1) each of the solid state light emitters in the first package can be separately addressable, or (2) each of the five solid state light emitters of the first group contained in the first package can be addressable as a series/parallel array, and each of the five solid state light emitters of the first group contained in the first package is addressable as a series/parallel array, the expression "series/parallel" array including but not limited to arrangements in which there are provided a plurality of subsets of emitters, the subsets being electrically connected in series, each subset including a plurality of emitters electrically connected in parallel.

The one or more luminescent materials can be any desired luminescent material. The one or more luminescent materials can be down-converting or up-converting, or can include a combination of both types. For example, the one or more luminescent materials can be selected from among phosphors, scintillators, day glow tapes, inks which glow in the visible spectrum upon illumination with ultraviolet light, etc.

The one or more luminescent materials can be provided in any desired form. For example, the luminescent element can be embedded in a resin (i.e., a polymeric matrix), such as a silicone material, an epoxy material, a glass material or a metal oxide material.

The one or more lumiphors can individually be any lumiphor, a wide variety of which, as noted above, are known to those skilled in the art. For example, the (or each of the) lumiphor(s) can comprise (or can consist essentially of, or can consist of) one or more phosphor. The (or each of the) one or more lumiphor(s) can, if desired, further comprise (or consist essentially of, or consist of) one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). For example, the thicker the lumiphor, in general, the lower the weight percentage of the phosphor can be.

The (or each of the) one or more lumiphor(s) can, independently, further comprise any of a number of well-known additives, e.g., diffusers, scatterers, tints, etc.

Representative examples of suitable LEDs (for use as the solid state light emitters) are described in:

(1) U.S. Patent Application No. 60/753,138, filed on Dec. 22, 2005, entitled "Lighting Device" (inventor: Gerald H. Negley) and U.S. patent application Ser. No. 11/614,180, filed Dec. 21, 2006 (now U.S. Patent Publication No. 2007/0236911), the entireties of which are hereby incorporated by reference;

(2) U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven) and U.S. patent application Ser. No. 11/624,811, filed Jan. 19, 2007 (now U.S. Patent Publication No. 2007/0170447, the entireties of which are hereby incorporated by reference;

(3) U.S. Patent Application No. 60/808,702, filed on May 26, 2006, entitled "Lighting Device" (inventors: Gerald H. Negley and Antony Paul van de Ven) and U.S. patent application Ser. No. 11/751,982, filed May 22, 2007 (now U.S. Patent Publication No. 2007/0274080, the entireties of which are hereby incorporated by reference;

(4) U.S. Patent Application No. 60/808,925, filed on May 26, 2006, entitled "Solid State Light Emitting Device and Method of Making Same" (inventors: Gerald H. Negley and Neal Hunter) and U.S. patent application Ser. No. 11/753,103, filed May 24, 2007 (now U.S. Patent Publication No. 2007/0280624), the entireties of which are hereby incorporated by reference;

(5) U.S. Patent Application No. 60/802,697, filed on May 23, 2006, entitled "Lighting Device and Method of Making" (inventor: Gerald H. Negley) and U.S. patent application Ser. No. 11/751,990, filed May 22, 2007 (now U.S. Patent Publication No. 2007/0274063), the entireties of which are hereby incorporated by reference;

(6) U.S. Patent Application No. 60/839,453, filed on Aug. 23, 2006, entitled "LIGHTING DEVICE AND LIGHTING METHOD" (inventors: Antony Paul van de Ven and Gerald H. Negley) and U.S. patent application Ser. No. 11/843,243, filed Aug. 22, 2007 (now U.S. Patent Publication No. 2008/0084685), the entireties of which are hereby incorporated by reference;

(7) U.S. Patent Application No. 60/857,305, filed on Nov. 7, 2006, entitled "LIGHTING DEVICE AND LIGHTING METHOD" (inventors: Antony Paul van de Ven and Gerald H. Negley; the entirety of which is hereby incorporated by reference;

(8) U.S. Patent Application No. 60/851,230, filed on Oct. 12, 2006, entitled "LIGHTING DEVICE AND METHOD OF MAKING SAME" (inventor: Gerald H. Negley; the entirety of which is hereby incorporated by reference.

In some embodiments of the present inventive subject matter, there are further provided one or more switches electrically connected to one of respective power lines, whereby the switch selectively switches on and off current to the solid state light emitter(s) on the respective power line.

In some lighting devices according to the present inventive subject matter, there are further included one or more circuitry components, e.g., drive electronics for supplying and controlling current passed through at least one of the one or more solid state light emitters in the lighting device. Persons of skill in the art are familiar with a wide variety of ways to supply and control the current passed through solid state light emitters, and any such ways can be employed in the devices of the present inventive subject matter. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired. For example, circuitry which may be used in practicing the present inventive subject matter is described in:

(1) U.S. Patent Application No. 60/752,753, filed on Dec. 21, 2005, entitled "Lighting Device" (inventors: Gerald H. Negley, Antony Paul van de Ven and Neal Hunter) and U.S. patent application Ser. No. 11/613,692, filed Dec. 20, 2006 (now U.S. Patent Publication No. 2007/0139923), the entireties of which are hereby incorporated by reference;

(2) U.S. Patent Application No. 60/798,446, filed on May 5, 2006, entitled "Lighting Device" (inventor: Antony Paul van de Ven) and U.S. patent application Ser. No. 11/743,754, filed May 3, 2007 (now U.S. Patent Publication No. 2007/0263393), the entireties of which are hereby incorporated by reference;

(3) U.S. Patent Application No. 60/809,959, filed on Jun. 1, 2006, entitled "Lighting Device With Cooling" (inventors: Thomas G. Coleman, Gerald H. Negley and Antony Paul van de Ven) and U.S. patent application Ser. No. 11/626,483, filed Jan. 24, 2007 (now U.S. Patent Publication No. 2007/0171145), the entireties of which are hereby incorporated by reference;

(4) U.S. Patent Application No. 60/809,595, filed on May 31, 2006, entitled "LIGHTING DEVICE AND METHOD OF LIGHTING" (inventor: Gerald H. Negley) and U.S. patent application Ser. No. 11/755,162, filed May 30, 2007 (now U.S. Patent Publication No. 2007/0279440), the entireties of which are hereby incorporated by reference; and (5) U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007 (now U.S. Patent Publication No. 2008/0088248), the entireties of which are hereby incorporated by reference.

The present inventive subject matter further relates to an illuminated enclosure, comprising an enclosed space and at least one lighting device according to the present inventive subject matter, wherein the lighting device illuminates at least a portion of the enclosed space.

The present inventive subject matter further relates to an illuminated surface, comprising a surface and at least one lighting device according to the present inventive subject matter, wherein the lighting device illuminates at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

In addition, persons of skill in the art are familiar with a wide variety of mounting structures for many different types of lighting, and any such structures can be used according to the present inventive subject matter. For example, FIG. 4 depicts a first embodiment of a lighting device in accordance with the present inventive subject matter.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

Referring to FIG. 4, there is shown a lighting device which includes a heat spreading element 11 (formed of aluminum), insulating regions 12 (comprising any desired material which is thermally conductive and not electrically conductive, a wide variety of which are well-known to those skilled in the art, e.g., ceramic, epoxy or silicone optionally filled with silicon carbide, diamond, cubic boron nitride, alumina, etc), a highly reflective surface 13 (formed in situ by polishing the surface of the aluminum heat spreading element, or made of MCPET® (marketed by Furukawa, a Japanese corporation)), conductive traces 14 formed of copper, a lead frame 15 formed of silver-plated copper (or silver-plated mild steel), packaged LEDs 16, a reflective cone 17 (made of MCPET®) (marketed by Furukawa, a Japanese corporation) with a diffuse light scattering surface and a diffusing element 18 (the diffusing element 18 performs a light scattering function).

The thickness of the heat spreading element 11 is about 3.0 mm.

The reflective cone 17 is about 1 mm thick.

The diffusing element 18 is about 3.0 mm thick and is made of glass or plastic with surface features.

The device depicted in FIG. 4 further includes a printed circuit board (PCB) 28 with the conductive traces 14. The PCB is about 1.6 mm thick and is FR4.

In some embodiments according to the present inventive subject matter, one or more of the solid state light emitters can be included in a package together with one or more of the lumiphors, and the one or more lumiphor in the package can be spaced from the one or more solid state light emitter in the package to achieve improved light extraction efficiency, as described in (1) U.S. Patent Application No. 60/753,138, filed on Dec. 22, 2005, entitled "Lighting Device" (inventor: Gerald H. Negley) and U.S. patent application Ser. No. 11/614,180, filed Dec. 21, 2006 (now U.S. Patent Publication No. 2007/0236911), the entireties of which are hereby incorporated by reference.

FIG. 5 depicts a representative example of a packaged LED which can be used in the devices according to the present inventive subject matter. Referring to FIG. 5, there is shown a packaged LED 16 which comprises a blue light emitting diode chip 31 (namely, a Cree XT LED (C460XT290) die with a wavelength range of from about 450 nm to about 465 nm, and optical power greater than 24 mW), a lead frame 15 having a reflective surface 32, a copper wire 33, an encapsulant region 34, and a broad spectrum emitting lumiphor 35. The reflective surface 32 is made of silver. The encapsulant region 34 is made of Hysol OS400 or GE/Toshiba Invisil 5332. The lumiphor 35 comprises a luminescent material consisting of QMK58/F-U1 YAG:Ce by PhosphorTeck—UK dispersed in a binder made of Hysol OS400 or GE/Toshiba 5332. The luminescent material is loaded in the binder in an amount in the range of from about 10 to about 12 percent by weight, based on the total weight of the binder and the luminescent material. The luminescent material particles have particle sizes in the range of from about 1.6 micrometers to about 8.6 micrometers, with the mean particle size being in the range of from about 4 micrometers to about 5 micrometers. The lumiphor 35 is spaced from the chip 31 by a distance in the range of from about 100 micrometers to about 750 micrometers (for example, from about 500 micrometers to about 750 micrometers, e.g., about 750 micrometers). The blue chip 31 emits light having a peak wavelength in the range of from about 450 nm to about 465 nm.

In some embodiments according to the present inventive subject matter, two or more lumiphors can be provided, two or more of the lumiphors being spaced from each other, as described in U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven) and U.S. patent application Ser. No. 11/624,811 (now U.S. Patent Publication No. 2007/0170447), filed Jan. 19, 2007, the entireties of which are hereby incorporated by reference.

In some lighting devices according to the present inventive subject matter, there are further included one or more power sources, e.g., one or more batteries and/or solar cells, and/or one or more standard AC power plugs.

The lighting devices according to the present inventive subject matter can comprise any desired number of solid state light emitters and lumiphors. For example, a lighting device according to the present inventive subject matter can include one or more light emitting diodes, 50 or more light emitting diodes, or 100 or more light emitting diodes, etc.

The sources of visible light in the lighting devices of the present inventive subject matter can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present inventive subject matter. The lighting devices of the present inventive subject matter can be electrically connected (or selectively connected) to any desired power source, persons of skill in the art being familiar with a variety of such power sources.

Representative examples of arrangements of sources of visible light, mounting structures, schemes for mounting sources of visible light, apparatus for supplying electricity to sources of visible light, housings for sources of visible light, fixtures for sources of visible light, power supplies for sources of visible light and complete lighting assemblies, all of which are suitable for the lighting devices of the present inventive subject matter, are described in:

(1) U.S. Patent Application No. 60/752,753, filed on Dec. 21, 2005, entitled "Lighting Device" (inventors: Gerald H. Negley, Antony Paul van de Ven and Neal Hunter) and U.S. patent application Ser. No. 11/613,692, filed Dec. 20, 2006 (now U.S. Patent Publication No. 2007/0139923), the entireties of which are hereby incorporated by reference;

(2) U.S. Patent Application No. 60/798,446, filed on May 5, 2006, entitled "Lighting Device" (inventor: Antony Paul van de Ven) and U.S. patent application Ser. No. 11/743,754, filed May 3, 2007 (now U.S. Patent Publication No. 2007/0263393), the entireties of which are hereby incorporated by reference;

(3) U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), and U.S. patent application Ser. No. 11/856,421, filed Sep. 17, 2007 (now U.S. Patent Publication No. 2008/0084700), the entireties of which are hereby incorporated by reference;

(4) U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), and U.S. patent application Ser. No. 11/859,048, filed Sep. 21, 2007 (now U.S. Patent Publication No. 2008/0084701), the entireties of which are hereby incorporated by reference;

(5) U.S. Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman) and U.S. patent application Ser. No. 11/755,153, filed May 30, 2007 (now U.S. Patent Publication No. 2008/0279903), the entireties of which are hereby incorporated by reference; and (6) U.S. Patent Application No. 60/858,558, filed on Nov. 13, 2006, entitled "LIGHTING DEVICE, ILLUMINATED ENCLOSURE AND LIGHTING METHODS" (inventor: Gerald H. Negley), the entirety of which is hereby incorporated by reference.

Any two or more structural parts of the lighting devices described herein can be integrated. Any structural part of the lighting devices described herein can be provided in two or more parts (which can be held together, if necessary).

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device comprising:
a first group of solid state light emitters, a first group of lumiphors, a second group of solid state light emitters, a second group of lumiphors and a third group of solid state light emitters, wherein:
if each of said first group of solid state light emitters is illuminated and each of said first group of lumiphors is excited, a mixture of light emitted from said first group of solid state light emitters and said first group of lumiphors would, in the absence of any additional light, have a first group mixed illumination having x, y color coordinates which define a point which is within an area on a 1931 CIE Chromaticity Diagram enclosed by first, second, third and fourth line segments, said first line segment connecting a first point to a second point, said second line segment connecting said second point to a third point, said third line segment connecting said third point to a fourth point, and said fourth line segment connecting said fourth point to said first point, said first point having x, y coordinates of 0.36, 0.48, said second point having x, y coordinates of 0.43, 0.45, said third point having x, y coordinates of 0.5125, 0.4866, and said fourth point having x, y coordinates of 0.4087, 0.5896;
if each of said second group of solid state light emitters is illuminated and each of said second group of lumiphors is excited, a mixture of light emitted from said second group of solid state light emitters and said second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, said fifth line segment connecting a fifth point to a sixth point, said sixth line segment connecting said sixth point to a seventh point, said seventh line segment connecting said seventh point to an eighth point, and said eighth line segment connecting said eighth point to said fifth point, said fifth point having x, y coordinates of 0.32, 0.40, said sixth point having x, y coordinates of 0.36, 0.38, said seventh point having x, y coordinates of 0.30, 0.26, and said eighth point having x, y coordinates of 0.25, 0.29;

if each of said first group of solid state light emitters and said second group of solid state light emitters is illuminated and each of said first group of lumiphors and said second group of lumiphors is excited, a mixture of light emitted from said first group of solid state light emitters, said second group of solid state light emitters, said first group of lumiphors and said second group of lumiphors would, in the absence of any additional light, have a first group-second group mixed illumination having x, y color coordinates which define a point which is within an area on a 1931 CIE Chromaticity Diagram enclosed by ninth, tenth, eleventh, twelfth and thirteenth line segments, said ninth line segment connecting a ninth point to a tenth point, said tenth line segment connecting said tenth point to an eleventh point, said eleventh line segment connecting said eleventh point to a twelfth point, said twelfth line segment connecting said twelfth point to a thirteenth point, and said thirteenth line segment connecting said thirteenth point to said ninth point, said ninth point having x, y coordinates of 0.32, 0.40, said tenth point having x, y coordinates of 0.36, 0.48, said eleventh point having x, y coordinates of 0.43, 0.45, said twelfth point having x, y coordinates of 0.42, 0.42, and said thirteenth point having x, y coordinates of 0.36, 0.38; and if each of said first group of solid state light emitters, said second group of solid state light emitters and said third group of solid state light emitters is illuminated and each of said first group of lumiphors and said second group of lumiphors is excited, a mixture of light emitted from said first group of solid state light emitters, said second group of solid state light emitters, said third group of solid state light emitters, said first group of lumiphors and said second group of lumiphors would, in the absence of any additional light, have a first group-second group-third group mixed illumination having x, y coordinates on a 1931 CIE Chromaticity Diagram which define a point which is within ten MacAdam ellipses of at least one point on the blackbody locus on a 1931 CIE Chromaticity Diagram.

2. A lighting device as recited in claim 1, wherein:
each of said first group of solid state light emitters, said second group of solid state light emitters and said third group of solid state light emitters is a light emitting diode.

3. A lighting device as recited in claim 1, wherein:
each of said first group of solid state light emitters and said second group of solid state light emitters, if illuminated, would emit light having a peak wavelength in the range of from 430 nm to 480 nm;
each of said first group of lumiphors and said second group of lumiphors, if excited, would emit light having a dominant wavelength in the range of from about 555 nm to about 585 nm; and
each of said third group of solid state light emitters, if illuminated, would emit light having a dominant wavelength in the range of from 600 nm to 630 nm.

4. A lighting device as recited in claim 3, wherein:
said first and second groups of solid state light emitters together comprise all of the solid state light emitters in said lighting device which, if illuminated, would emit light having a peak wavelength in the range of from about 430 nm to about 480 nm;
said first and second groups of lumiphors together comprise all of the lumiphors in said lighting device which, if excited, would emit light having a dominant wavelength in the range of from about 555 nm to about 585 nm; and
said third group of solid state light emitters comprise all of the solid state light emitters in said lighting device which, if illuminated, would emit light having a dominant wavelength in the range of from about 600 nm to about 630 nm.

5. A lighting device as recited in claim 1, further comprising at least one power line, said first and second groups of solid state light emitters together comprising all solid state light emitters which, if illuminated, would emit light having a peak wavelength in the range of from 430 nm to 480 nm, and wherein each of said first and second groups of solid state light emitters are illuminated if power is supplied to said at least one power line.

6. A lighting device as recited in claim 5, wherein said first and second groups of lumiphors together comprise all of the lumiphors in said lighting device which, if excited, would emit light having a dominant wavelength in the range of from about 555 nm to about 585 nm, and each of said first and second groups of lumiphors is excited if power is supplied to said at least one power line.

7. A lighting device as recited in claim 5, wherein said power line comprises a wire.

8. A lighting device as recited in claim 5, further comprising a power plug directly or switchably electrically connected to said power line.

9. A lighting device as recited in claim 1, wherein if all of said solid state light emitters in said first and second groups of solid state light emitters are illuminated, each of said lumiphors in said first and second groups of lumiphors would be excited by light emitted from at least one of said solid state light emitters.

10. A lighting device as recited in claim 1, wherein each of said solid state light emitters in said first and second groups of solid state light emitters is embedded within an encapsulant element in which one of said first and second groups of lumiphors is also embedded.

11. A lighting device as recited in claim 1, wherein:
said first and second groups of solid state light emitters together comprise at least five solid state light emitters; and
said first and second groups of lumiphors together comprise at least five lumiphors.

12. A lighting device as recited in claim 1, wherein:
said first and second groups of solid state light emitters together comprise at least ten solid state light emitters; and
said first and second groups of lumiphors together comprise at least ten lumiphors.

13. A lighting device as recited in claim 1, wherein:
said first and second groups of solid state light emitters together comprise at least twenty-five solid state light emitters; and said first and second groups of lumiphors together comprise at least twenty-five lumiphors.

14. A lighting device as recited in claim 1, wherein if every solid state light emitter in said lighting device is illuminated:
said first group-second group mixed illumination will have x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to said fifth point, said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38; and
said first group-second group-third group mixed illumination will have x, y coordinates on a 1931 CIE Chromaticity Diagram which define a point which is within ten MacAdam ellipses of at least one point on the blackbody locus on a 1931 CIE Chromaticity Diagram.

15. A lighting device as recited in claim 1, wherein said lighting device further comprises at least one power line, and if power is supplied to each of said at least one power line:
said first group-second group mixed illumination will have x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to said fifth point, said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38; and
said first group-second group-third group mixed illumination will have x, y coordinates on a 1931 CIE Chromaticity Diagram which define a point which is within ten MacAdam ellipses of at least one point on the blackbody locus on a 1931 CIE Chromaticity Diagram.

16. A lighting device as recited in claim 1, wherein said lighting device, when supplied with electricity of a first wattage, emits output light of an efficacy of at least 60 lumens per watt of said electricity.

17. A lighting device as recited in claim 16, wherein said output light is of a brightness of at least 300 lumens.

18. A lighting device as recited in claim 16, wherein said output light is of a brightness of at least 500 lumens.

19. A lighting device as recited in claim 1, wherein said lighting device, when supplied with electricity of a first wattage, emits output light of an efficacy of at least 70 lumens per watt of said electricity.

20. A lighting device as recited in claim 1, wherein said lighting device, when supplied with electricity of a first wattage, emits output light of an efficacy of at least 80 lumens per watt of said electricity.

21. A lighting device as recited in claim 1, wherein said first group-second group mixed illumination has x, y coordinates on a 1931 CIE Chromaticity Diagram which are also at least a distance of 0.03 from any point on the blackbody locus.

22. A lighting device as recited in claim 1, wherein said first group-second group mixed illumination has x, y color coordinates on a 1931 CIE Chromaticity Diagram which are also at least a distance of 0.045 from any point on the blackbody locus.

23. A lighting device as recited in claim 1, wherein each of said first group of solid state light emitters is positioned separately, each of said second group of solid state light emitters is positioned separately, and each of said third group of solid state light emitters is positioned separately.

24. A lighting device as recited in claim 1, wherein each of said first group of solid state light emitters is packaged separately, each of said second group of solid state light emitters is packaged separately, and each of said third group of solid state light emitters is packaged separately.

25. A lighting device as recited in claim 1, wherein at least a first plurality of said solid state light emitters is contained in a first package.

26. A lighting device as recited in claim 25, wherein said first package comprises at least five of said first group of solid state light emitters and at least five of said second group of solid state light emitters.

27. A lighting device as recited in claim 26, wherein each of the solid state light emitters in said first package is separately addressable.

28. A lighting device as recited in claim 26, wherein each of the five solid state light emitters of said first group contained in said first package is addressable as a series/parallel array, and each of the five solid state light emitters of said first group contained in said first package is addressable as a series/parallel array.

29. An enclosure, comprising an enclosed space and at least one lighting device as recited in claim 1, wherein if said lighting device is illuminated, said lighting device would illuminate at least a portion of said enclosed space.

30. A lighting element, comprising a surface and at least one lighting device as recited in claim 1, wherein if said lighting device is illuminated, said lighting device would illuminate at least a portion of said surface.

31. A structure comprising at least one item selected from among the group consisting of motion sensors, mobile phones, signage, flashing lights, doorbell indicators, emergency lighting, auxiliary lighting, outdoor illumination, emergency egress lighting, and backlights, said structure comprising at least one lighting device as recited in claim 1.

32. A light fixture comprising at least one lighting device as recited in claim 1.

33. A lighting device comprising:
a first group of solid state light emitters, a first group of lumiphors, a second group of solid state light emitters, a second group of lumiphors and a third group of solid state light emitters, wherein:
if each of said first group of solid state light emitters is illuminated and each of said first group of lumiphors is excited, a mixture of light emitted from said first group of solid state light emitters and said first group of lumiphors would, in the absence of any additional light, have a first group mixed illumination having x, y color coordinates which define a point which is within an area on a 1931 CIE Chromaticity Diagram enclosed by first, second, third and fourth line segments, said first line segment connecting a first point to a second point, said second line segment connecting said second point to a third point, said third line segment connecting said third point to a fourth point, and said fourth line segment connecting said fourth point to said first point, said first point having x, y coordinates of 0.41, 0.455, said second point having x, y coordinates of 0.36, 0.48, said third point having x, y coordinates of 0.4087, 0.5896, and said fourth point having x, y coordinates of 0.4788, 0.5202;

if each of said second group of solid state light emitters is illuminated and each of said second group of lumiphors is excited, a mixture of light emitted from said second group of solid state light emitters and said second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, said fifth line segment connecting a fifth point to a sixth point, said sixth line segment connecting said sixth point to a seventh point, said seventh line segment connecting said seventh point to an eighth point, and said eighth line segment connecting said eighth point to said fifth point, said fifth point having x, y coordinates of 0.32, 0.40, said sixth point having x, y coordinates of 0.36, 0.38, said seventh point having x, y coordinates of 0.30, 0.26, and said eighth point having x, y coordinates of 0.25, 0.29;

if each of said first group of solid state light emitters and said second group of solid state light emitters is illuminated and each of said first group of lumiphors and said second group of lumiphors is excited, a mixture of light emitted from said first group of solid state light emitters, said second group of solid state light emitters, said first group of lumiphors and said second group of lumiphors would, in the absence of any additional light, have a first group-second group mixed illumination having x, y color coordinates which define a point which is within an area on a 1931 CIE Chromaticity Diagram enclosed by ninth, tenth, eleventh and twelfth line segments, said ninth line segment connecting a ninth point to a tenth point, said tenth line segment connecting said tenth point to an eleventh point, said eleventh line segment connecting said eleventh point to a twelfth point, and said twelfth line segment connecting said twelfth point to said ninth point, said ninth point having x, y coordinates of 0.32, 0.40, said tenth point having x, y coordinates of 0.36, 0.38, said eleventh point having x, y coordinates of 0.41, 0.455, and said twelfth point having x, y coordinates of 0.36, 0.48; and if each of said first group of solid state light emitters, said second group of solid state light emitters and said third group of solid state light emitters is illuminated and each of said first group of lumiphors and said second group of lumiphors is excited, a mixture of light emitted from said first group of solid state light emitters, said second group of solid state light emitters, said third group of solid state light emitters, said first group of lumiphors and said second group of lumiphors would, in the absence of any additional light, have a first group-second group-third group mixed illumination having x, y coordinates on a 1931 CIE Chromaticity Diagram which define a point which is within ten MacAdam ellipses of at least one point on the blackbody locus on a 1931 CIE Chromaticity Diagram.

34. A lighting device as recited in claim 33, wherein:
each of said first group of solid state light emitters, said second group of solid state light emitters and said third group of solid state light emitters is a light emitting diode.

35. A lighting device as recited in claim 33, wherein:
each of said first group of solid state light emitters and said second group of solid state light emitters, if illuminated, would emit light having a peak wavelength in the range of from 430 nm to 480 nm;
each of said first group of lumiphors and said second group of lumiphors, if excited, would emit light having a dominant wavelength in the range of from about 555 nm to about 585 nm; and
each of said third group of solid state light emitters, if illuminated, would emit light having a dominant wavelength in the range of from 600 nm to 630 nm.

36. A lighting device as recited in claim 35, wherein:
said first and second groups of solid state light emitters together comprise all of the solid state light emitters in said lighting device which, if illuminated, would emit light having a peak wavelength in the range of from about 430 nm to about 480 nm;
said first and second groups of lumiphors together comprise all of the lumiphors in said lighting device which, if excited, would emit light having a dominant wavelength in the range of from about 555 nm to about 585 nm; and
said third group of solid state light emitters comprise all of the solid state light emitters in said lighting device which, if illuminated, would emit light having a dominant wavelength in the range of from about 600 nm to about 630 nm.

37. A lighting device as recited in claim 33, further comprising at least one power line, said first and second groups of solid state light emitters together comprising all solid state light emitters which, if illuminated, would emit light having a peak wavelength in the range of from 430 nm to 480 nm, and wherein each of said first and second groups of solid state light emitters are illuminated if power is supplied to said at least one power line.

38. A lighting device as recited in claim 37, wherein said first and second groups of lumiphors together comprise all of the lumiphors in said lighting device which, if excited, would emit light having a dominant wavelength in the range of from about 555 nm to about 585 nm, and each of said first and second groups of lumiphors is excited if power is supplied to said at least one power line.

39. A lighting device as recited in claim 37, wherein said power line comprises a wire.

40. A lighting device as recited in claim 37, further comprising a power plug directly or switchably electrically connected to said power line.

41. A lighting device as recited in claim 33, wherein if all of said solid state light emitters in said first and second groups of solid state light emitters are illuminated, each of said lumiphors in said first and second groups of lumiphors would be excited by light emitted from at least one of said solid state light emitters.

42. A lighting device as recited in claim 33, wherein each of said solid state light emitters in said first and second groups of solid state light emitters is embedded within an encapsulant element in which one of said first and second groups of lumiphors is also embedded.

43. A lighting device as recited in claim 33, wherein:
said first and second groups of solid state light emitters together comprise at least five solid state light emitters; and
said first and second groups of lumiphors together comprise at least five lumiphors.

44. A lighting device as recited in claim 33, wherein:
said first and second groups of solid state light emitters together comprise at least ten solid state light emitters; and
said first and second groups of lumiphors together comprise at least ten lumiphors.

45. A lighting device as recited in claim 33, wherein:
said first and second groups of solid state light emitters together comprise at least twenty-five solid state light emitters; and
said first and second groups of lumiphors together comprise at least twenty-five lumiphors.

46. A lighting device as recited in claim 33, wherein if every solid state light emitter in said lighting device is illuminated:
said first group-second group mixed illumination will have x, y color coordinates which define a point which is within an area on a 1931 CIE Chromaticity Diagram enclosed by said ninth, tenth, eleventh and twelfth line segments; and
said first group-second group-third group mixed illumination will have x, y coordinates on a 1931 CIE Chromaticity Diagram which define a point which is within ten MacAdam ellipses of at least one point on the blackbody locus on a 1931 CIE Chromaticity Diagram.

47. A lighting device as recited in claim 33, wherein said lighting device further comprises at least one power line, and if power is supplied to each of said at least one power line:
said first group-second group mixed illumination will have x, y color coordinates which define a point which is within an area on a 1931 CIE Chromaticity Diagram enclosed by said ninth, tenth, eleventh and twelfth line segments; and
said first group-second group-third group mixed illumination will have x, y coordinates on a 1931 CIE Chromaticity Diagram which define a point which is within ten MacAdam ellipses of at least one point on the blackbody locus on a 1931 CIE Chromaticity Diagram.

48. A lighting device as recited in claim 33, wherein said lighting device, when supplied with electricity of a first wattage, emits output light of an efficacy of at least 60 lumens per watt of said electricity.

49. A lighting device as recited in claim 48, wherein said output light is of a brightness of at least 300 lumens.

50. A lighting device as recited in claim 48, wherein said output light is of a brightness of at least 500 lumens.

51. A lighting device as recited in claim 33, wherein said lighting device, when supplied with electricity of a first wattage, emits output light of an efficacy of at least 70 lumens per watt of said electricity.

52. A lighting device as recited in claim 33, wherein said lighting device, when supplied with electricity of a first wattage, emits output light of an efficacy of at least 80 lumens per watt of said electricity.

53. A lighting device as recited in claim 33, wherein said first group-second group mixed illumination has x, y color coordinates on a 1931 CIE Chromaticity Diagram which are also at least a distance of 0.03 from any point on the blackbody locus.

54. A lighting device as recited in claim 33, wherein said first group-second group mixed illumination has x, y color coordinates on a 1931 CIE Chromaticity Diagram which are also at least a distance of 0.045 from any point on the blackbody locus.

55. A lighting device as recited in claim 33, wherein each of said first group of solid state light emitters is positioned separately, each of said second group of solid state light emitters is positioned separately, and each of said third group of solid state light emitters is positioned separately.

56. A lighting device as recited in claim 33, wherein each of said first group of solid state light emitters is packaged separately, each of said second group of solid state light emitters is packaged separately, and each of said third group of solid state light emitters is packaged separately.

57. A lighting device as recited in claim 33, wherein at least a first plurality of said solid state light emitters is contained in a first package.

58. A lighting device as recited in claim 57, wherein said first package comprises at least five of said first group of solid state light emitters and at least five of said second group of solid state light emitters.

59. A lighting device as recited in claim 58, wherein each of the solid state light emitters in said first package is separately addressable.

60. A lighting device as recited in claim 58, wherein each of the five solid state light emitters of said first group contained in said first package is addressable as a series/parallel array, and each of the five solid state light emitters of said first group contained in said first package is addressable as a series/parallel array.

61. A method of lighting, comprising:
mixing light from a first group of at least one solid state light emitter, light from a second group of at least one solid state light emitter, light from a third group of at least one solid state light emitter, light from a first group of at least one lumiphor and light from a second group of at least one lumiphor to form first group-second group-third group mixed illumination, wherein:
a mixture of light emitted from said first group of solid state light emitters and said first group of lumiphors would, in the absence of any additional light, have a first group mixed illumination having x, y color coordinates which define a point which is within an area on a 1931 CIE Chromaticity Diagram enclosed by first, second, third and fourth line segments, said first line segment connecting a first point to a second point, said second line segment connecting said second point to a third point, said third line segment connecting said third point to a fourth point, and said fourth line segment connecting said fourth point to said first point, said first point having x, y coordinates of 0.36, 0.48, said second point having x, y coordinates of 0.43, 0.45, said third point having x, y coordinates of 0.5125, 0.4866, and said fourth point having x, y coordinates of 0.4087, 0.5896;
a mixture of light emitted from said second group of solid state light emitters and said second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, said fifth line segment connecting a fifth point to a sixth point, said sixth line segment connecting said sixth point to a seventh point, said seventh line segment connecting said seventh point to an eighth point, and said eighth line segment connecting said eighth point to said fifth point, said fifth point having x, y coordinates of 0.32, 0.40, said sixth point having x, y coordinates of 0.36, 0.38, said seventh point having x, y coordinates of 0.30, 0.26, and said eighth point having x, y coordinates of 0.25, 0.29;
a mixture of light emitted from said first group of solid state light emitters, said second group of solid state light emitters, said first group of lumiphors and said second group of lumiphors would, in the absence of any additional light, have a first group-second group mixed illumination having x, y color coordinates which define a point which is within an area on a 1931 CIE Chromaticity Diagram enclosed by ninth, tenth, eleventh, twelfth and thirteenth line segments, said ninth line segment connecting a ninth point to a tenth point, said tenth line segment connecting said tenth point to an eleventh point, said eleventh line segment connecting said eleventh point to a twelfth point, said twelfth line segment connecting said twelfth point to a thirteenth point, and said thirteenth line segment connecting said thirteenth point to said ninth point, said ninth point having x, y coordinates of 0.32, 0.40, said tenth point having x, y coordinates of 0.36, 0.48, said eleventh point having x, y coordinates of 0.43, 0.45, said twelfth point having x, y coordinates of 0.42, 0.42, and said thirteenth point having x, y coordinates of 0.36, 0.38; and said first group-second group-third group mixed illumination having x, y coordinates on a 1931 CIE Chromaticity Diagram which define a point which is within ten MacAdam ellipses of at least one point on said blackbody locus on a 1931 CIE Chromaticity Diagram.

62. A method as recited in claim 61, wherein:

said light from each of said first group of at least one light emitting diode and each of said second group of at least one light emitting diode has a peak wavelength in the range of from 430 nm to 480 nm; and said light from each of said first group of at least one lumiphor and each of said second group of at least one lumiphor has a dominant wavelength in the range of from 555 nm to 585 nm.

63. A method as recited in claim 62, wherein each of said first and second groups of lumiphors which has a dominant wavelength in the range of from 555 nm to 585 nm is combined in a package with at least one light emitting diode having a peak wavelength in the range of from 430 nm to 480 nm.

64. A method as recited in claim 61, wherein:

said first and second groups of light emitting diodes together comprise at least five light emitting diodes; and said first and second groups of lumiphors together comprise at least five lumiphors.

65. A method as recited in claim 61, wherein:

said first and second groups of light emitting diodes together comprise at least ten light emitting diodes; and said first and second groups of lumiphors together comprise at least ten lumiphors.

66. A method as recited in claim 61, wherein:

said first and second groups of light emitting diodes together comprise at least twenty-five light emitting diodes; and said first and second groups of lumiphors together comprise at least twenty-five lumiphors.

67. A method of lighting, comprising:

mixing light from a first group of at least one solid state light emitter, light from a second group of at least one solid state light emitter, light from a third group of at least one solid state light emitter, light from a first group of at least one lumiphor and light from a second group of at least one lumiphor to form first group-second group-third group mixed illumination, wherein:

a mixture of light emitted from said first group of solid state light emitters and said first group of lumiphors would, in the absence of any additional light, have a first group mixed illumination having x, y color coordinates which define a point which is within an area on a 1931 CIE Chromaticity Diagram enclosed by first, second, third and fourth line segments, said first line segment connecting a first point to a second point, said second line segment connecting said second point to a third point, said third line segment connecting said third point to a fourth point, and said fourth line segment connecting said fourth point to said first point, said first point having x, y coordinates of 0.41, 0.455, said second point having x, y coordinates of 0.36, 0.48, said third point having x, y coordinates of 0.4087, 0.5896, and said fourth point having x, y coordinates of 0.4788, 0.5202;

a mixture of light emitted from said second group of solid state light emitters and said second group of lumiphors would, in the absence of any additional light, have a second group mixed illumination having x, y color coordinates which define a point which is within an area on a 1931 CIE Chromaticity Diagram enclosed by fifth, sixth, seventh and eighth line segments, said fifth line segment connecting a fifth point to a sixth point, said sixth line segment connecting said sixth point to a seventh point, said seventh line segment connecting said seventh point to an eighth point, and said eighth line segment connecting said eighth point to said fifth point, said fifth point having x, y coordinates of 0.32, 0.40, said sixth point having x, y coordinates of 0.36, 0.38, said seventh point having x, y coordinates of 0.30, 0.26, and said eighth point having x, y coordinates of 0.25, 0.29;

a mixture of light emitted from said first group of solid state light emitters, said second group of solid state light emitters, said first group of lumiphors and said second group of lumiphors would, in the absence of any additional light, have a first group-second group mixed illumination having x, y color coordinates which define a point which is within an area on a 1931 CIE Chromaticity Diagram enclosed by ninth, tenth, eleventh and twelfth line segments, said ninth line segment connecting a ninth point to a tenth point, said tenth line segment connecting said tenth point to an eleventh point, said eleventh line segment connecting said eleventh point to a twelfth point, and said twelfth line segment connecting said twelfth point to said ninth point, said ninth point having x, y coordinates of 0.32, 0.40, said tenth point having x, y coordinates of 0.36, 0.38, said eleventh point having x, y coordinates of 0.41, 0.455, and said twelfth point having x, y coordinates of 0.36, 0.48; and said first group-second group-third group mixed illumination having x, y coordinates on a 1931 CIE Chromaticity Diagram which define a point which is within ten MacAdam ellipses of at least one point on the blackbody locus on a 1931 CIE Chromaticity Diagram.

68. A method as recited in claim 67, wherein:

said light from each of said first group of at least one light emitting diode and each of said second group of at least one light emitting diode has a peak wavelength in the range of from 430 nm to 480 nm; and said light from each of said first group of at least one lumiphor and each of said second group of at least one lumiphor has a dominant wavelength in the range of from 555 nm to 585 nm.

69. A method as recited in claim 68, wherein each of said first and second groups of lumiphors which has a dominant wavelength in the range of from 555 nm to 585 nm is combined in a package with at least one light emitting diode having a peak wavelength in the range of from 430 nm to 480 nm.

70. A method as recited in claim 67, wherein:

said first and second groups of light emitting diodes together comprise at least five light emitting diodes; and said first and second groups of lumiphors together comprise at least five lumiphors.

71. A method as recited in claim 67, wherein:

said first and second groups of light emitting diodes together comprise at least ten light emitting diodes; and said first and second groups of lumiphors together comprise at least ten lumiphors.

72. A method as recited in claim 67, wherein:

said first and second groups of light emitting diodes together comprise at least twenty-five light emitting diodes; and said first and second groups of lumiphors together comprise at least twenty-five lumiphors.

* * * * *

UNITED STATES PATENT AND TRADEMARK OFFICE
CERTIFICATE OF CORRECTION

PATENT NO. : 7,918,581 B2 Page 1 of 1
APPLICATION NO. : 11/951626
DATED : April 5, 2011
INVENTOR(S) : Antony Paul Van De Ven et al.

It is certified that error appears in the above-identified patent and that said Letters Patent is hereby corrected as shown below:

Column 22

*Line 1*: please change "2008/0279903" to --2007/0279903--

Signed and Sealed this
Seventh Day of June, 2011

David J. Kappos
*Director of the United States Patent and Trademark Office*